United States Patent [19]

Kaufman

[11] Patent Number: 4,907,124
[45] Date of Patent: Mar. 6, 1990

[54] BOLTED CIRCUIT ASSEMBLY WITH ISOLATING WASHER

[76] Inventor: Lance R. Kaufman, 8001 N. Mohave, Paradise Valley, Ariz. 85253

[21] Appl. No.: 239,622

[22] Filed: Sep. 1, 1988

[51] Int. Cl.⁴ .............................................. H05K 7/20
[52] U.S. Cl. ................................. 361/386; 174/16.3; 361/387; 361/388
[58] Field of Search ............................ 165/80.3, 185; 174/16 HS, 138 D; 357/80-81; 361/386-389

[56] References Cited

U.S. PATENT DOCUMENTS

| | | |
|---|---|---|
| 3,369,597 | 2/1968 | Dronsuth et al. ............ 361/386 |
| 3,571,663 | 3/1971 | Hungate ..................... 361/388 |
| 3,958,075 | 5/1976 | Kaufman . |
| 4,156,148 | 5/1979 | Kaufman . |
| 4,196,411 | 4/1980 | Kaufman . |
| 4,215,235 | 7/1980 | Kaufman . |
| 4,218,724 | 8/1980 | Kaufman . |
| 4,250,481 | 2/1981 | Kaufman . |
| 4,266,140 | 5/1981 | Kaufman . |
| 4,394,530 | 7/1983 | Kaufman . |
| 4,449,165 | 5/1984 | Kaufman . |
| 4,449,292 | 5/1984 | Kaufman . |
| 4,488,202 | 12/1984 | Kaufman . |
| 4,498,120 | 2/1985 | Kaufman . |
| 4,546,410 | 10/1985 | Kaufman . |
| 4,546,411 | 10/1985 | Kaufman . |
| 4,554,613 | 11/1985 | Kaufman . |
| 4,574,162 | 3/1986 | Kaufman . |
| 4,574,879 | 3/1986 | DeGree et al. ............... 174/16 HS |
| 4,577,387 | 3/1986 | Kaufman . |
| 4,630,174 | 12/1986 | Kaufman . |
| 4,646,203 | 2/1987 | Ngo et al. .................. 361/388 |
| 4,700,273 | 10/1987 | Kaufman . |
| 4,713,723 | 12/1987 | Kaufman . |
| 4,724,514 | 2/1988 | Kaufman . |
| 4,739,449 | 4/1988 | Kaufman . |

FOREIGN PATENT DOCUMENTS

| | | | |
|---|---|---|---|
| 242052 | 12/1962 | Australia | 174/16.3 |
| 0659585 | 3/1963 | Canada | 174/16 HS |
| 2050837 | 4/1972 | Fed. Rep. of Germany | 361/387 |

OTHER PUBLICATIONS

Madrange et al, "Diode Mounting Device", IBM Technical Disclosure Bulletin, vol. 11, No. 7, 12/68, p. 771.

Primary Examiner—Gregory D. Thompson
Attorney, Agent, or Firm—Andrus, Sceales, Starke & Sawall

[57] ABSTRACT

An electrical circuit assembly (2) includes a heat sink (4), a ceramic substrate (6) on top of the heat sink (4), heat generating electrical components (8), including circuit elements (10) and lead frames (12), on top of the substrate. A threaded bolt (28) extends through aligned holes (22, 18, 16, 14) in the lead frame, substrate and heat sink and is electrically isolated from the lead frame and prevents short circuiting between the lead frame and the heat sink by a ceramic washer (24) having a lower annular portion (26) extending axially downwardly in the aligned holes around the bolt and having an upper radially extended shoulder flange (27) beneath an enlarged head (32) of the bolt.

1 Claim, 1 Drawing Sheet

BOLTED CIRCUIT ASSEMBLY WITH ISOLATING WASHER

BACKGROUND AND SUMMARY

The invention relates to mounting arrangements for electrical circuit assemblies.

Electrical circuit assemblies typically include a heat sink, an electrically insulating thermally conductive substrate, such as ceramic, on the heat sink, and electrical component means on top of the substrate and generating heat in response to conduction of current. The electrical component means typically includes a plurality of lead frames electrically connected to a plurality of electric circuit elements including high power semiconductor chips. Mounting arrangements of the lead frames to the ceramic substrate, and the ceramic substrate to the heat sink, include soldering and direct eutectic bonding.

Mounting problems arise as lateral dimensions increase. For example, in a 5" by 8" array, it may be deemed more desirable to use a bolted mounting arrangement or some other arrangement rather than soldering or direct bonding.

The present invention provides a mounting arrangement having desirable application in large lateral circuit assemblies, though the invention may be used in other applications.

DETAILED DESCRIPTION

Figure 1:
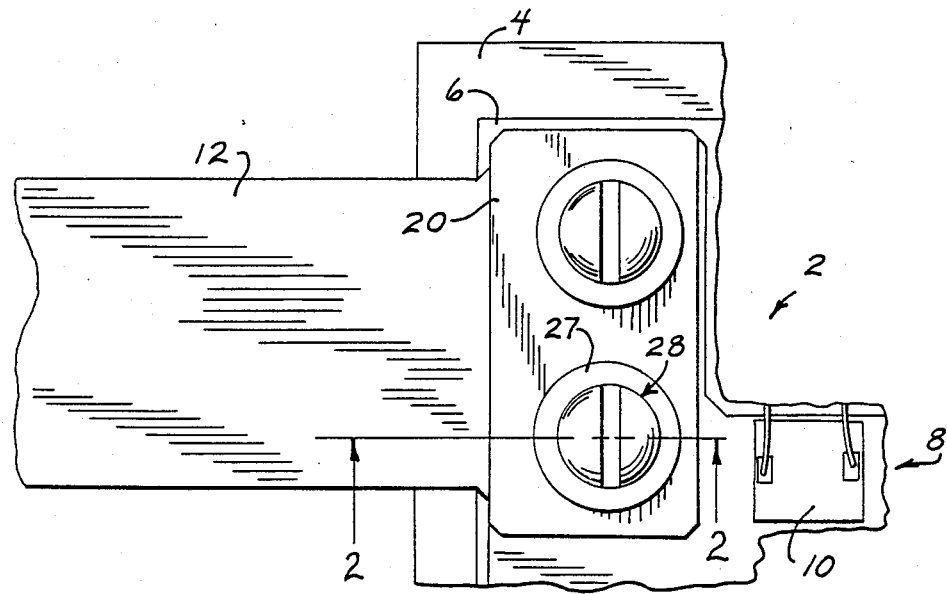
FIG. 1 is a top view of an electrical circuit assembly in accordance with the invention.
Figure 2:
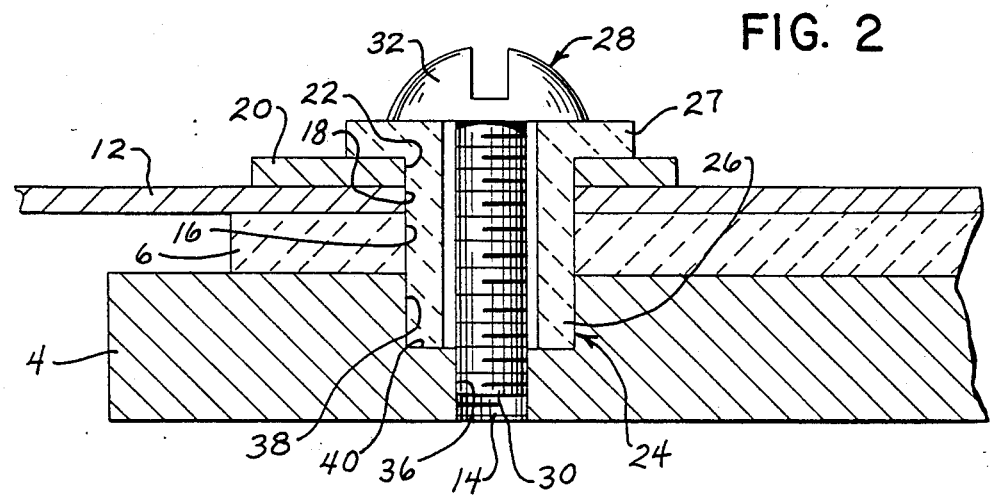
FIG. 2 is a sectional view taken along line 2—2 of FIG. 1.

The present invention arose during continuing development efforts in electrical circuit assembly such as shown in my prior U.S. Pat. Nos. 3,958,075, 4,156,148, 4,196,411, 4,215,235, 4,218,724, 4,250,481, 4,266,140, 4,394,530, 4,449,165, 4,449,292, 4,488,202, 4,498,120, 4,546,410, 4,546,411, 4,554,613, 4,574,162, 4,577,387, 4,630,174, 4,700,273, 4,713,723, 4,724,514, 4,739,449, incorporated herein by reference.

An electrical circuit assembly 2 includes a copper base plate or heat sink 4, an electrically insulating thermally conductive ceramic substrate 6 on top of the heat sink, and electrical component means 8 on top of the substrate and generating heat in response to conduction of current through the electrical component means 8. The electrical component means includes an electric circuit element such as a power semiconductor chip 10 and a plurality of lead frames such as 12 electrically connected thereto, all as is known in the art, and for which further reference may be had to the above incorporated patents.

Heat sink 4, substrate 6 and lead frame 12 have aligned holes 14, 16 and 18 therein. The lead frame may include an upper copper plate 20 which likewise has an aligned hole 22 therethrough. An annular electrically insulating thermally conductive ceramic washer 24 has a lower portion 26 extending axially downwardly in holes 22, 18, 16 and 14, and an integral upper shoulder flange 27 extending radially outwardly therefrom. A mounting bolt 28 has a threaded shank 30 extending axially downwardly through the washer and has an enlarged upper head 32 engaging the top of upper radial shoulder flange 27 of the washer.

Hole 14 in heat sink 4 is countersunk, and has a lower threaded bore 36 threadingly receiving threaded shank 30, and has an upper nonthreaded larger diameter bore 38 receiving and locating lower axial portion 26 of washer 24 seated therein and stopped against step shoulder 40. The underside of enlarged head 32 of the bolt bears against radial shoulder flange 27 of the washer which in turn bears against lead frame plate 20 and lead frame 12 which in turn bears against ceramic substrate 6 which in turn bears against heat sink 4, to thus mount the assembly in sandwiched compressed relation. Shoulder flange 27 extends radially outwardly beyond enlarged head 32 of the bolt. Lower axial portion 26 of the washer has an axial height substantially equal to the axial height of upper bore 38 of the heat sink hole, plus the axial height of the substrate hole 16, plus the axial height of the lead frame hole 18 including the height of hole 22 if top plate 20 is used.

Shank 30 of bolt 28 is spaced radially inwardly of the circumferential periphery of the holes through the lead frame and substrate and the upper bore 38 of the hole in the heat sink. Lower axial portion 26 of washer 24 extends axially downwardly in the radial gap between shank 30 and such hole peripheries. Washer 24 electrically isolates lead frame 12 from mounting bolt 28. Washer 24 annularly surrounds shank 30 and prevents short circuiting between lead frame 12 and heat sink 4 through shank 30.

It is recognized that various equivalents, alternatives and modifications are possible within the scope of the appended claims.

I claim:

1. An electrical circuit assembly comprising:
a heat sink;
an electrically insulating thermally conductive substrate on top of said heat sink;
electrical component means on top of said substrate and generating heat in response to conduction of current through said electrical component means, said electrical component means including a circuit element and lead frame means electrically connected to said element;
said lead frame means, said substrate and said heat sink having aligned holes therein, said heat sink hole being countersunk and having a lower bore and an upper larger diameter bore;
an electrically insulating washer having a lower annular portion extending downwardly through said hole in said lead frame means, through said hole in said substrate, and into said upper bore of said hole in said heat sink, said washer having an upper shoulder;
a mounting bolt extending axially downwardly within said lower annular portion of said washer through said hole in said lead frame means, through said hole in said substrate, through said upper bore of said hole in said heat sink, and into said lower bore of said hole in said heat sink, said mounting bolt having an upper enlarged head engaging said upper shoulder of said washer such that the underside of said enlarged head bears against said shoulder which in turn bears against said lead frame means which in turn bears against said substrate which in turn bears against said heat sink, to mount said assembly in sandwiched compressed relation, wherein said hole in said heat sink has a step shoulder between said upper and lower bores, the axial height of said lower annular portion of said washer is substantially equal to the axial height of said upper bore of said hole in said heat sink plus the axial height of said hole in said substrate plus the axial height of said hole in said lead frame means, and wherein said upper shoulder of said washer extends integrally radially outwardly from the remainder of said washer and horizontally between the top of said lead frame means and the underside of said enlarged head of said bolt.

* * * * *